United States Patent
Hagihara et al.

(10) Patent No.: US 9,017,493 B2
(45) Date of Patent: Apr. 28, 2015

(54) METHOD OF MANUFACTURING A SPUTTERING TARGET AND SPUTTERING TARGET

(75) Inventors: Junichirou Hagihara, Tomisato (JP); Shuichi Higashi, Tomisato (JP); Shozo Kambara, Sammu (JP)

(73) Assignee: Ulvac, Inc., Kanagawa (JP)

( * ) Notice: Subject to any disclaimer, the term of this patent is extended or adjusted under 35 U.S.C. 154(b) by 462 days.

(21) Appl. No.: 13/144,538

(22) PCT Filed: Aug. 10, 2010

(86) PCT No.: PCT/JP2010/005029
§ 371 (c)(1),
(2), (4) Date: Jul. 14, 2011

(87) PCT Pub. No.: WO2011/018895
PCT Pub. Date: Feb. 17, 2011

(65) Prior Publication Data
US 2012/0132523 A1 May 31, 2012

(30) Foreign Application Priority Data
Aug. 12, 2009 (JP) .................. 2009-087272

(51) Int. Cl.
*C23C 14/34* (2006.01)
*C22F 1/00* (2006.01)
(Continued)

(52) U.S. Cl.
CPC ............... *C23C 14/3414* (2013.01); *B21J 1/02* (2013.01); *B21J 1/025* (2013.01); *C22F 1/00* (2013.01); *C22F 1/04* (2013.01); *C22F 1/08* (2013.01); *C22F 1/18* (2013.01)

(58) Field of Classification Search
CPC ................ B21J 1/025; B21J 1/06; B21J 5/00; B21J 5/02
USPC ......................................................... 148/559
See application file for complete search history.

(56) References Cited

U.S. PATENT DOCUMENTS 5,169,126 A 12/1992 Reeve et al.
5,501,893 A 3/1996 Laermer et al.
(Continued)

FOREIGN PATENT DOCUMENTS

EP 0292037 A1 11/1988
JP 02-167890 A 6/1990
(Continued)

*Primary Examiner* — Jie Yang
*Assistant Examiner* — Xiaowei Su
(74) *Attorney, Agent, or Firm* — Harness, Dickey & Pierce, PLC

(57) ABSTRACT

[Object] To provide a method of manufacturing a sputtering target and a sputtering target that are capable of achieving refinement and uniformity of crystal grains.
[Solving Means] A method of manufacturing a sputtering target according to an embodiment of the present invention includes forging an ingot formed of metal by applying a stress in a first axis direction (z-axis direction) and a plane direction (xy-plane direction) orthogonal to the first axis direction. The ingot is additionally forged by applying a stress in a second axis direction (axial directions $c_{11}$, $c_{12}$, $c_{21}$, $c_{22}$) obliquely intersecting with a direction parallel to the first axis direction. The ingot is heat-treated at a temperature equal to or higher than a recrystallization temperature thereof. In such a manner, since slip deformation can be caused not only in the first axis direction and the plane direction orthogonal thereto but also in the second axis direction, the high density and uniformity of an internal stress can be achieved.

3 Claims, 7 Drawing Sheets

(51) Int. Cl.
  *B21J 1/02*  (2006.01)
  *C22F 1/04*  (2006.01)
  *C22F 1/08*  (2006.01)
  *C22F 1/18*  (2006.01)

(56) References Cited

U.S. PATENT DOCUMENTS

| | | | |
|---|---|---|---|
| 5,876,861 A | 3/1999 | Kondo et al. | |
| 6,113,761 A * | 9/2000 | Kardokus et al. | 204/298.13 |
| 2003/0098103 A1* | 5/2003 | Perry et al. | 148/577 |
| 2011/0214987 A1* | 9/2011 | Holcomb et al. | 204/298.13 |

FOREIGN PATENT DOCUMENTS

| | | |
|---|---|---|
| JP | 07-328979 A | 12/1995 |
| JP | 09-207039 A | 8/1997 |
| JP | 10-184931 A | 7/1998 |
| JP | 10-195609 A | 7/1998 |
| JP | 10-195610 A | 7/1998 |
| JP | 10-195611 A | 7/1998 |
| JP | 11-326857 A | 11/1999 |
| JP | 2001-133745 A | 5/2001 |
| JP | 2001-271163 A | 10/2001 |
| JP | 2002-069626 A | 3/2002 |
| JP | 2003-049264 A | 2/2003 |
| JP | 2003-127988 A | 5/2003 |
| JP | 2004-154909 A | 6/2004 |
| JP | 2005-255701 A | 9/2005 |
| JP | 2006-100485 A | 4/2006 |
| JP | 3819797 B | 9/2006 |
| JP | 2006-281424 A | 10/2006 |
| JP | 2007-258573 A | 10/2007 |
| JP | 2007-297679 A | 11/2007 |
| JP | 2007-327118 A | 12/2007 |
| JP | 2010-065252 A | 3/2010 |
| WO | 95/23988 A1 | 9/1995 |
| WO | 2006/003962 A1 | 1/2006 |
| WO | WO 2010051040 A1 * | 5/2010 |

* cited by examiner (a) Grain diameter : 66μm (b) Grain diameter : 93μm

METHOD OF MANUFACTURING A SPUTTERING TARGET AND SPUTTERING TARGET

TECHNICAL FIELD

The present invention relates to a method of manufacturing a sputtering target formed by forging metal, and a sputtering target manufactured by the method.

BACKGROUND ART

In recent years, sputtering methods have been widely used for deposition of metal layers or insulating layers in the manufacturing fields of semiconductor apparatuses, solar cells, and electronic devices using FPD (Flat Panel Display) and MEMS (Micro-Electro-Mechanical Systems) techniques. In a sputtering method, plasma is formed in a vacuum chamber in which a target formed of a deposition material and a substrate are opposed to each other, and sputtering particles from the target that are generated by causing ions in plasma to come into collision with the target are deposited on the substrate, to thereby form a film.

Stable sputtering of a target and a film quality of a thin film to be formed depend on the quality of a target to be used to a large extent. Specifically, a sputtering target is required to have high relative density, a uniform composition, fine crystal grains, and the like. For example, in the manufacturing of a metal target, an ingot formed of crystalline metal is subjected to machining such as rolling or forging, thus obtaining the characteristics described above.

For example, Patent Document 1 discloses a method of manufacturing an aluminum alloy sputtering target, in which an ingot as an alloy of aluminum and copper is subjected to cold working and the working material is rapidly cooled after being annealed at a predetermined temperature in a flow of argon.

Further, Patent Document 2 discloses a method of manufacturing a cobalt target for sputtering, in which a cobalt ingot is subjected to hot forging and hot rolling to produce a plate material, the thickness of the plate material is made uniform, and then a cold rolling process in biaxial directions at the same rolling ratio and a heat treatment process at a predetermined temperature are repeated.

Patent Document 1: Japanese Patent Application Laid-open No. 2002-69626 (paragraph [0006])

Patent Document 2: Japanese Patent Application Laid-open No. 2007-297679 (paragraph [0015])

DISCLOSURE OF THE INVENTION

Problem to be Solved by the Invention

In a conventional method of manufacturing a sputtering target, three-dimensionally assuming XYZ axes, a direction of a stress applied to an ingot is along each of the XYZ axes. Therefore, dislocation caused by slip deformation of crystals is formed only in a coaxial direction and the concentration and overlap of the dislocation in the coaxial direction cannot be avoided. As a result, an internal stress becomes uneven and it is difficult to efficiently make the size of crystal grains fine.

Further, in the case where a working material is heat-treated after rolling or forging, recrystallization nuclei are unevenly formed due to variations of the internal stress. Specifically, the grain size of the recrystallized grains is largely different between an area in which the slip deformation is caused frequently (area with high dislocation density) and an area in which the slip deformation is relatively less caused (area with low dislocation density), which makes it extremely difficult to uniformly form a fine structure.

In view of the circumstances as described above, it is an object of the present invention to provide a method of manufacturing a sputtering target and a sputtering target that are capable of achieving refinement and uniformity of crystal grains.

Means for Solving the Problem

To achieve the above object, according to an embodiment of the present invention, there is provided a method of manufacturing a sputtering target, the method including forging an ingot formed of metal by applying a stress in a first axis direction and a plane direction orthogonal to the first axis direction. The ingot is additionally forged by applying a stress in a second axis direction obliquely intersecting with a direction parallel to the first axis direction. The ingot is heat-treated at a temperature equal to or higher than a recrystallization temperature thereof.

Further, according to an embodiment of the present invention, there is provided a sputtering target including a target body and a surface to be sputtered. The target body has a plate shape formed of metal. The surface to be sputtered has an average grain diameter of 70 μm or less and a crystal orientation in which an X-ray intensity ratio of a (111) surface to a (200) surface is 0.3 or less.

BEST MODES FOR CARRYING OUT THE INVENTION

Figure 1:
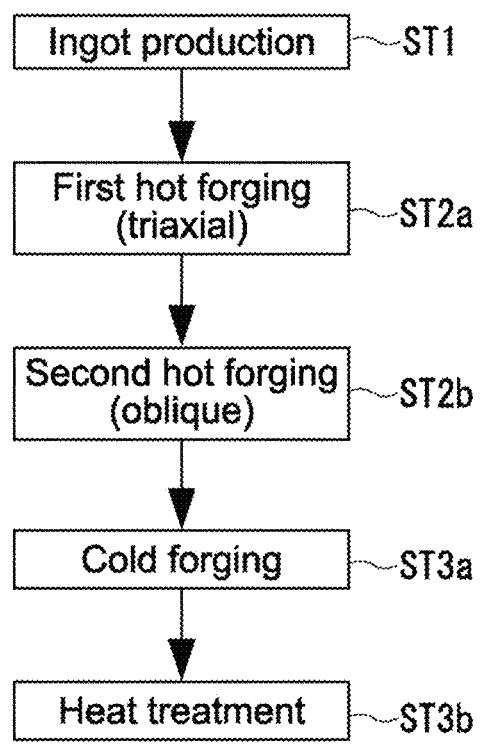
FIG. 1 A process chart for explaining a method of manufacturing a sputtering target according to a first embodiment of the present invention.

According to an embodiment of the present invention, there is provided a method of manufacturing a sputtering target, the method including forging an ingot formed of metal by applying a stress in a first axis direction and a plane direction orthogonal to the first axis direction. The ingot is additionally forged by applying a stress in a second axis direction obliquely intersecting with a direction parallel to the first axis direction. The ingot is heat-treated at a temperature equal to or higher than a recrystallization temperature thereof.

In the method of manufacturing a sputtering target, in the forging of an ingot, a stress is applied not only in the first axis direction and the plane direction orthogonal thereto but also the second axis direction intersecting with those directions. In this manner, since slip deformation can be caused not only in the first axis direction and the plane direction orthogonal thereto but also the second axis direction, the high density and uniformity of an internal stress can be achieved. Accordingly, it is possible to avoid the concentration of loads toward a coaxial direction and suppress the unevenness of a dislocation density. The heat treatment process aims at removing the internal distortion of the ingot and rearranging crystals. The heat treatment process may be performed after the ingot is formed in a shape of a target (plate shape) or may be performed as a part of the forging process of the ingot (for example, hot forging).

According to the method of manufacturing a sputtering target, an average grain diameter of crystal grains can be set to 70 μm or less, for example. Further, it is possible to manufacture a sputtering target including a surface to be sputtered with a crystal orientation in which an X-ray intensity ratio of a (111) surface to a (200) surface is 0.3 or less.

The applying the stress in the plane direction orthogonal to the first axis direction may include deforming the ingot from a cylindrical shape to a rectangular parallelepiped shape. In this case, the applying the stress in the second axis direction includes compression-deforming the ingot having the rectangular parallelepiped shape between opposed sides or opposed corners of the ingot.

Accordingly, slip deformation can be caused with ease in the ingot having the rectangular parallelepiped shape not only in longitudinal, lateral, and height directions thereof but also in an oblique direction.

The method of manufacturing a sputtering target may further include forging the ingot by applying a stress in a third axis direction that obliquely intersects with the direction parallel to the first axis direction and is not parallel to the second axis direction.

Accordingly, the size of grains can be made finer.

The metal is not particularly limited and the crystal structure (face-centered cubic, body-centered cubic lattice, hexagonal close-packed structure, etc.) is also not limited. As the metal described above, for example, tantalum, titanium, aluminum, copper, crystalline metal (polycrystalline metal) containing any of them as a main component, or an apply thereof.

Further, according to an embodiment of the present invention, there is provided a sputtering target including a target body and a surface to be sputtered. The target body has a plate shape formed of metal. The surface to be sputtered has an average grain diameter of 70 μm or less and a crystal orientation in which an X-ray intensity ratio of a (111) surface to a (200) surface is 0.3 or less.

According to the sputtering target, since a fine and uniform crystal structure and a stable crystal orientation are provided, it is possible to stabilize sputtering and uniform a film quality.

Hereinafter, embodiments of the present invention will be described with reference to the drawings.

First Embodiment

Figure 2:
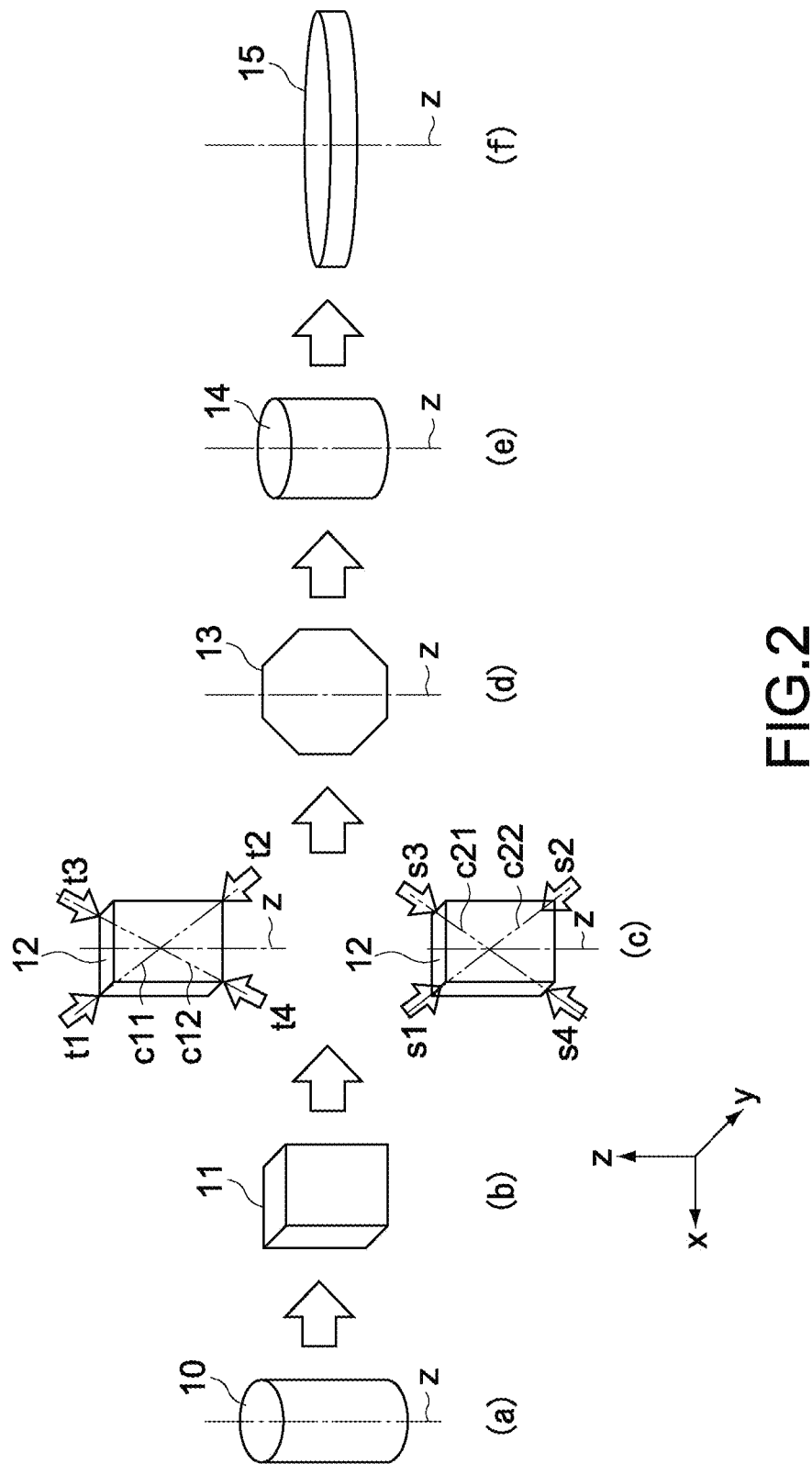
FIG. 2 Schematic views of processes for explaining the method of manufacturing a sputtering target.

FIG. 1 is a process chart showing a method of manufacturing a sputtering target according to an embodiment of the present invention. FIG. 2 are schematic views showing states of modification of an ingot in respective processes.

A manufacturing process for a sputtering target in this embodiment includes an ingot production process ST1, a first hot forging process ST2a, a second hot forging process ST2b, a cold forging process ST3a, and a heat treatment process ST3b.

(Ingot Production Process)

In this embodiment, a crystalline alloy mainly containing Al is used as an ingot 10. As the aluminum alloy, an Al—Cu alloy, an Al—Si alloy, an Al—Si—Cu alloy, or the like is applicable. Further, constituent metals of the ingot 10 are not limited to aluminum and an alloy thereof. For example, pure metals such as tantalum, titanium, and copper or alloys containing any of them as a main component are applicable.

The ingot 10 as an aluminum alloy is produced by casting molten aluminum alloy. The shape and size of the ingot 10 are not particularly limited, and are set as appropriate in accordance with the size of a target to be manufactured. For example, in the case where a target having a diameter of 300 to 350 mm and a thickness of 20 to 30 mm is manufactured, the ingot 10 can be formed in a cylindrical shape having a diameter of 160 to 200 mm and a height of 200 to 250 mm (FIG. 2(a)). A surface orientation of an upper surface of the ingot 10 (flat surface orthogonal to z axis) is (200), for example.

(First Hot Forging Process)

In the first hot forging process ST2a, the ingot 10 is deformed from the cylindrical shape to a rectangular parallelepiped shape (FIG. 2(b)). In this process, a compressive stress is applied to the ingot 10 heated to 250 to 420° C. along a z-axis direction (first axis direction) as a height direction. Simultaneously, a stress is applied in an xy-plane direction orthogonal to the z axis to produce an ingot 11 having a rectangular parallelepiped shape from the ingot 10 having a cylindrical shape (FIG. 2(b)).

The deformation operation in the z-axis direction and that in the xy-plane direction may be performed simultaneously or alternately. In the case where those deformation operations are simultaneously performed, a predetermined forging die may be used, for example. On the other hand, the deformation operation in the xy-plane direction may also be performed simultaneously or alternately in an x-axis direction and a y-axis direction.

The heat temperature of the ingot 10 is not limited to the above example and can be set to an appropriate temperature. For example, the heat temperature is set to such a temperature that is equal to or higher than a recrystallization temperature of the ingot 10 and does not cause cracking due to working at a time of forging. A working ratio in the first hot forging process is also not limited particularly and is determined as appropriate in accordance with a material, a heat temperature, or aimed material characteristics.

In the first hot forging process, compressive deformation processing in the z-axis direction and the xy-plane direction is repeatedly performed. This operation is also referred to as knead forging. By the deformation operations in the triaxial directions as described above (x-axis, y-axis, and z-axis directions), slip deformation is caused in the internal structure of the ingot 10 along the triaxial directions.

After the first hot forging is completed, the ingot 10 is subjected to water quenching (WQ). With this operation, crystals are prevented from returning to the original positions along slip lines (slip surfaces). Then, the ingot 11 having the rectangular parallelepiped shape is cut into a predetermined thickness, to thereby produce ingot pieces 12 each having a rectangular parallelepiped shape. Subsequently, the second hot forging process is performed on the ingot pieces 12.

(Second Hot Forging Process)

In the second hot forging process ST2b, an ingot piece 12 having a rectangular parallelepiped shape is compression-deformed between opposing corners or opposing sides of the ingot piece having a rectangular parallelepiped shape. Specifically, as shown in FIG. 2(c), when a long side direction of the ingot piece 12 is directed to the z-axis direction, for example, a stress is applied along an axial direction obliquely intersecting with a direction parallel to the z axis (for example, c11, c12, c21, c22). A processing temperature at this time can be set to, for example, 250 to 420° C. as in the case of the first hot forging process.

Here, the c11 axis indicates an axial direction connecting one vertex t1 of the ingot piece 12 on the upper surface and one vertex t2 on the lower surface in an opposed relationship with the vertex t1. Further, the c12 axis indicates an axial direction connecting another vertex t3 of the ingot piece 12 on the upper surface and another vertex t4 on the lower surface in an opposed relationship with the vertex t3. As a matter of course, though not limited to the above, a compressive stress may also be imparted to an axial direction connecting the other two vertexes on the upper surface and two vertexes on the lower surface opposed thereto.

Further, the c21 axis indicates an axial direction connecting one side s1 of the ingot piece 12 on the upper surface and one side s2 on the lower surface in an opposed relationship with the side s1. Furthermore, the c22 axis indicates an axial direction connecting another side s3 of the ingot piece 12 on the upper surface and another side s4 on the lower surface in an opposed relationship with the side s3. As a matter of course, though not limited to the above, a compressive stress may also be imparted to an axial direction connecting the other two sides on the upper surface and two sides on the lower surface opposed thereto.

The compressive stress imparted to the ingot piece 12 in the oblique direction may be applied between opposing corners or between opposing sides of the ingot piece 12, or may be applied between opposing corners and between opposing sides thereof. Though not limited to examples in which the compressive stress is applied to all the sets of opposing corners or opposing sides, the compressive stress may be applied to any of the sets of opposing corners or opposing sides. Further, the compression processing in the oblique direction is not limited to the case of being performed once per direction, and may be repeated more than once.

Through the forging processing as described above, an ingot piece 13 having a polyhedron shape as shown in FIG. 2(d) is formed from the ingot piece 12 having the rectangular parallelepiped shape. In the ingot piece 13, slip deformation is caused not only in the z-axis direction and the xy-plane direction but also in the oblique axial directions of c11, c12, c21, c22, and the like so that the high density and uniformity of an internal stress can be achieved. Accordingly, it is possible to avoid the concentration of loads toward the z-axis direction and the xy-plane direction and suppress the unevenness of a dislocation density.

After that, the ingot piece 13 subjected to the forging processing from the oblique directions is deformed into an ingot piece 14 having a cylindrical shape as shown in FIG. 2(e) by a stress imparted thereto in the z-axis direction and the xy-plane direction. The size of the ingot piece 14 is not particularly limited and is 330 mm in diameter and 40 mm in height, for example.

(Cold Forging Process)

In the cold forging process ST3a, the ingot piece 14 having a cylindrical shape is deformed into a disc-like formed body 15 as shown in FIG. 2(f). The formed body 15 is formed by compression-deforming the ingot piece 14 in the z-axis direction. The size of the formed body 15 is not particularly limited and is 360 mm in diameter and 30 mm in thickness, for example. To produce the formed body 15, a closed-die forging method or a rolling method can be adopted, for example. The processing temperature is not particularly limited, and may be set to room temperature.

(Heat Treatment Process)

The heat treatment process ST3b is a process in which an ingot piece 15 produced through the first and second forging processes ST2a and ST2b is heated to a predetermined temperature equal to or higher than a recrystallization temperature for a predetermined period of time to recrystallize the internal structure of the formed body 15. The processing temperature is set to 280° C. or higher and 350° C. or lower, for example, and the processing time is set to one hour, for example.

By the recrystallization processing of the formed body 15, internal distortion is eliminated and rearrangement of crystals is promoted. In this embodiment, since the high density and uniformity of the internal stress is achieved through the forging processes ST2a and ST2b described above, nucleation at a time of recrystallization can be made uniform. Further, since the slip deformation is caused not only in the z-axis direction and the xy-plane direction but also in the directions obliquely intersecting therewith, dislocation lines three-dimensionally overlap in layers. As a result, crystal grains are made fine and distributed uniformly. Therefore, fine recrystallized grains can be uniformly grown by this heat treatment. The grain size of the recrystallized grains is 60 to 70 μm, for example. As to a crystal orientation, an X-ray intensity ratio of a (111) surface to a (200) surface can be suppressed to 0.3 or less.

After the heat treatment, the formed body 15 is processed into a desired shape, size, and thickness, to thereby manufacture a sputtering target.

The sputtering target manufactured as described above includes a plate-shaped target body formed of crystalline metal and a surface to be sputtered that constitutes a part of the surface of the target body. The surface to be sputtered has an average grain diameter of 70 μm or less and a crystal orientation in which an X-ray intensity ratio of a (111) surface to a (200) surface is 0.3 or less. According to the sputtering target, since a fine and uniform crystal structure and a stable crystal orientation are provided, it is possible to stabilize sputtering and uniform a film quality.

Figure 3:
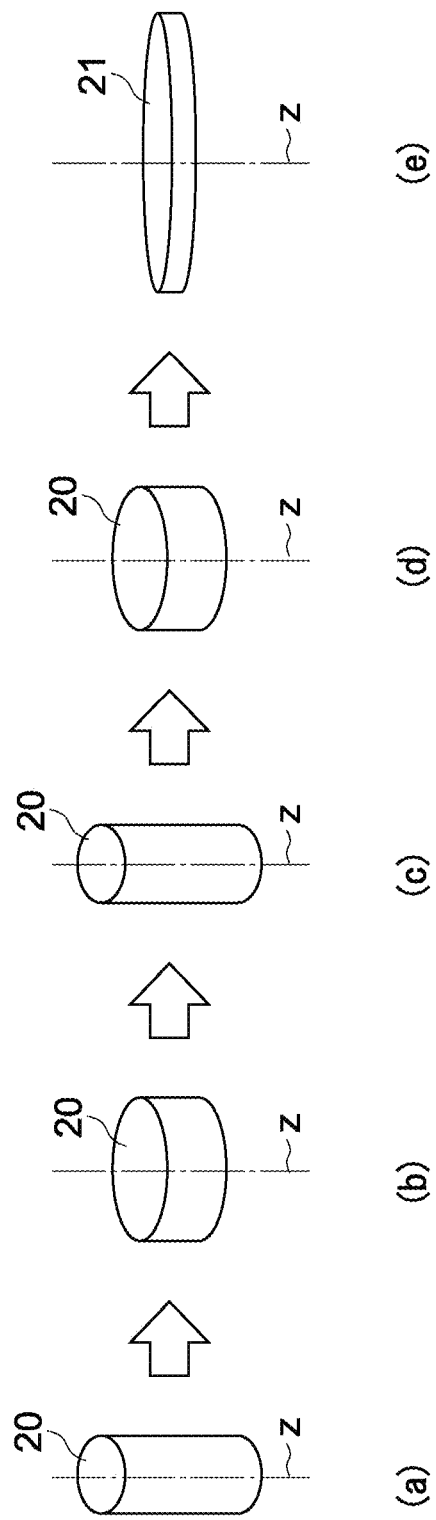
FIG. 3 Schematic views of processes for explaining a method of manufacturing a sputtering target according to Comparative Example.

FIG. 3 are views of processes showing one method of manufacturing a sputtering target shown as Comparative Example. Here, there is shown an example in which an ingot 20 having a cylindrical shape shown in FIG. 3(a) is alternately subjected to compressive deformation along the z-axis direction and compressive deformation along a plane direction orthogonal to the z axis (FIGS. 3(b) to (d)) and thereafter a disc-like formed body 21 is produced. After that, the formed body 21 is subjected to predetermined heat treatment and then processed into the shape of a target.

In the manufacturing method shown in FIG. 3, since the forging processing for the ingot 20 is limited in the z-axis direction and the plane direction orthogonal thereto, the dislocation caused by the slip deformation of crystals is formed only in those directions, which inevitably leads to the concentration of dislocation in a coaxial direction. Therefore, an internal stress becomes uneven and it becomes difficult to efficiently make the size of crystal grains fine. Further, the grain size of recrystallized grains is largely different between an area with a high dislocation density and an area with a low dislocation density, and it becomes extremely difficult to uniformly form a fine structure and it is also impossible to stabilize the crystal orientation.

Figure 4:
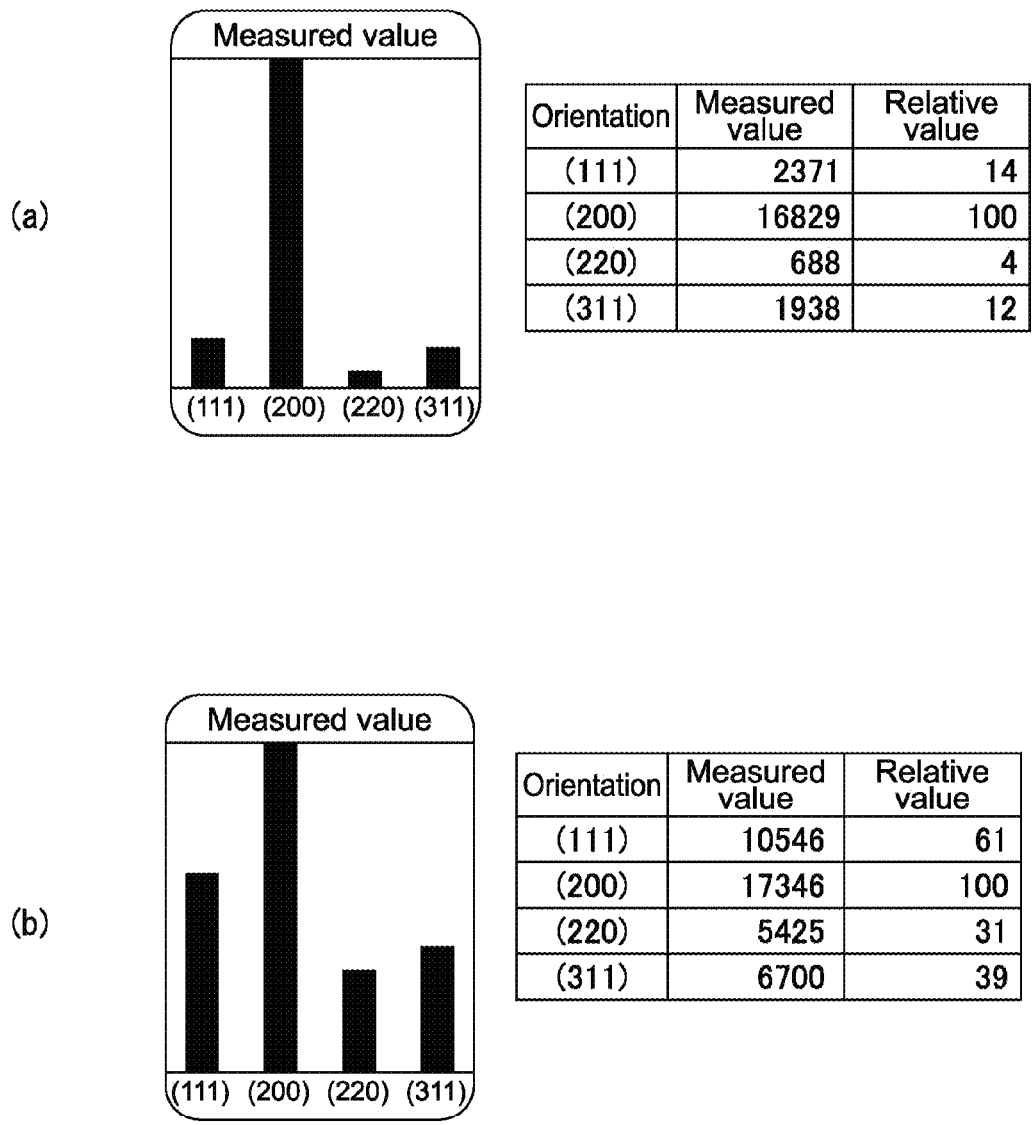
FIG. 4 Diagrams showing examples of results of X-ray diffraction; (a) shows a sample according to the embodiment and (b) shows a sample according to Comparative Example.

FIG. 4(a) shows results of X-ray diffraction of a surface to be sputtered of a sputtering target according to this embodiment, which is manufactured through the processes shown in FIG. 2. FIG. 4(b) shows results of X-ray diffraction of a surface to be sputtered of a sputtering target according to Comparative Example, which is manufactured through the processes shown in FIG. 3. The composition of an ingot used in the experiments was Al-0.5% Cu. From the results of FIG. 4, the X-ray intensity ratio of a (111) surface to a (200) surface was 0.63±0.31 in Comparative Example, while the X-ray intensity ratio thereof was 0.17±0.15 in this embodiment. According to this embodiment, the crystal orientation can be stably aligned toward the (200) surface.

Figure 5:
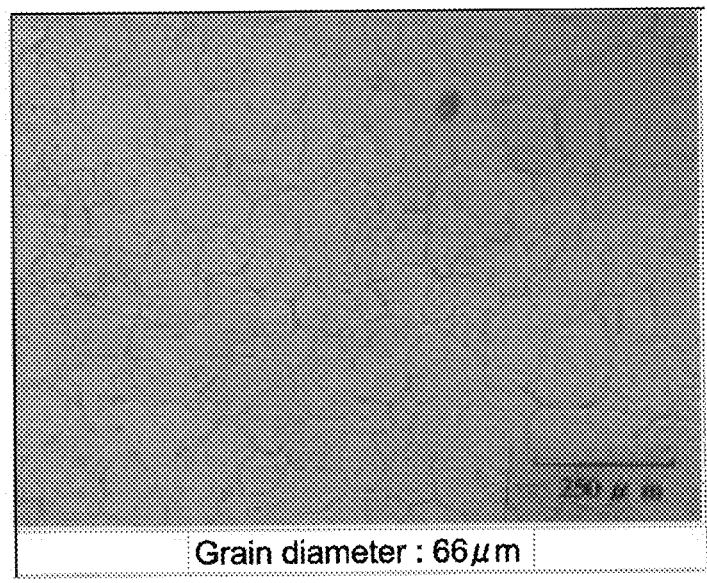
FIG. 5 Examples of a picture of the structure; (a) shows a sample according to the embodiment and (b) shows a sample of Comparative Example.
Figure 5:
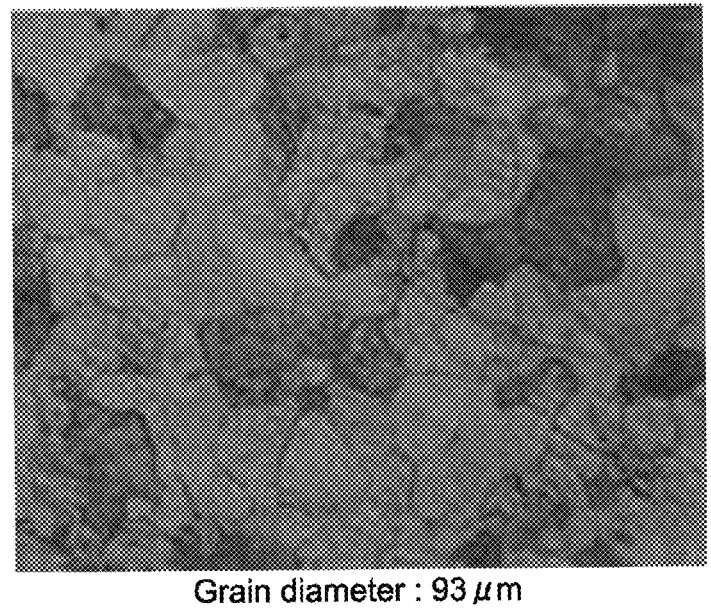

Further, an average crystal grain was 91 μm±10.3 μm in Comparative Example, while it was 62 μm±5.1 μm in this embodiment. FIG. 5 each show an example of a picture of the structure. FIG. 5(a) is a micrograph of the surface to be sputtered of the sputtering target according to this embodiment, and FIG. 5(b) is a micrograph of the surface to be sputtered of the sputtering target according to Comparative Example. In this embodiment, grain boundaries each have the shape of a pentagon or hexagon. This is considered because the crystal grains are deformed so as to be turned due to a stress applied not only in the triaxial directions but also in the oblique direction. Further, with such deformation, it is considered that nuclear growth at a time of recrystallization is controlled, which consequently leads to the stabilization of the crystal orientation.

Second Embodiment

Figure 6:
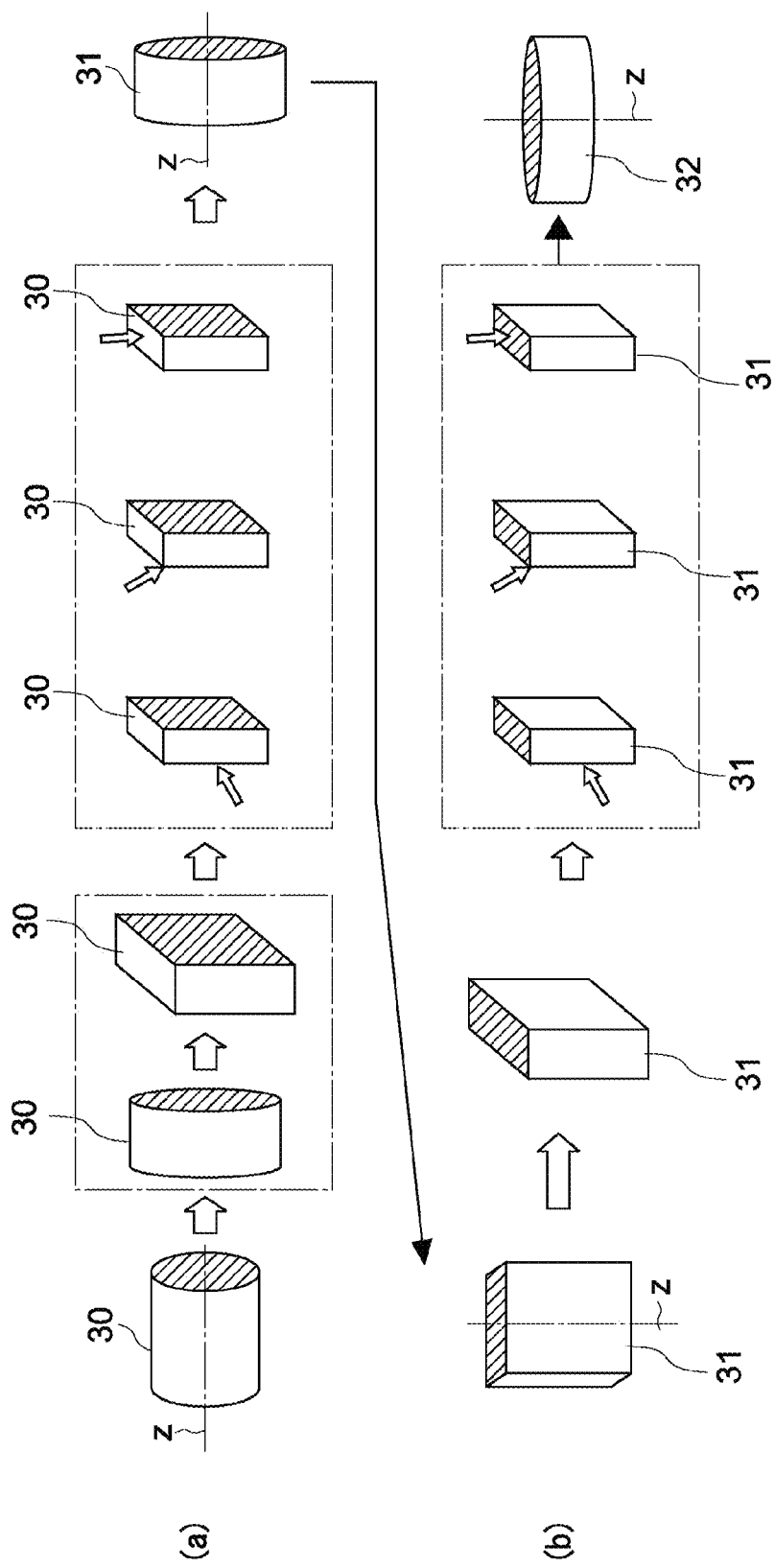
FIG. 6 Schematic views of processes for explaining a method of manufacturing a sputtering target according to a second embodiment of the present invention.

FIG. 6 show another embodiment of the present invention. In this embodiment, a processing method in which the direction of an ingot is changed and forging processing from an oblique direction is repeated. This forging processing is performed as hot forging or cold forging and the details of the respective processes are the same as those in the above first embodiment, so overlapping description thereof will be omitted here.

First, as shown in FIG. 6(a), an upper surface of an ingot 30 having a cylindrical shape (indicated by hatching in the figure) is turned to a horizontal direction, and a stress is applied thereto in a z-axis direction (height direction) and a plane direction orthogonal thereto to form the ingot 30 into a rectangular parallelepiped shape. After that, a compressive stress is applied to opposing sides and opposing corners of the ingot 30 formed into the rectangular parallelepiped shape so that slip deformation is caused in an oblique direction with respect to the z-axis direction. Then, the side surfaces of the ingot are compression-deformed to produce an ingot 31 having a cylindrical shape.

Next, after the ingot 31 is subjected to additional heat treatment as needed, an upper surface of the ingot 31 (indicated by hatching in the figure) is turned to a vertical direction as shown in FIG. 6(b), and the operations described above are repeated again. Specifically, a compressive stress is applied to the ingot 31 having the cylindrical shape in the plane direction orthogonal to the z-axis direction to produce the ingot 31 having a rectangular parallelepiped shape, and a compressive stress is applied to opposing sides and opposing corners of the ingot 31 so that slip deformation is caused in an oblique direction with respect to the z-axis direction.

After that, the ingot 31 is deformed to be disc-like to obtain a formed body 32. This process may be performed by cold forging. Then, the ingot 31 is subjected to predetermined heat treatment and necessary machining, with the result that a desired sputtering target is obtained.

According to this embodiment, a sputtering target having similar characteristics to those in the first embodiment described above can be manufactured. Particularly according to this embodiment, since the forging processing in an oblique direction is repeated while the direction of the ingot is changed, it is possible to make crystal grains finer and more uniform.

Hitherto, the embodiments of the present invention have been described, and as a matter of course, the present invention is not limited thereto and may be variously changed based on the technical idea of the present invention.

Figure 7:
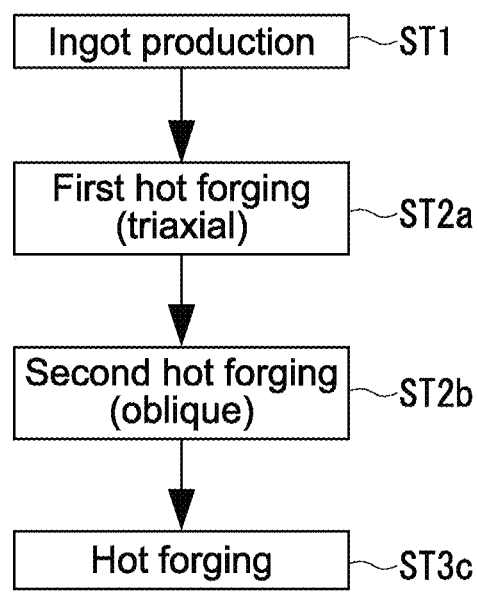
FIG. 7 A process chart showing a modified example of FIG. 1.

For example, in the embodiments described above, the cold forging process (ST3a) and the heat treatment process (ST3b) are performed after the second hot forging process (ST2b) from an oblique direction. Instead, as shown in FIG. 7, rolling into a plate shape and heat treatment for recrystallization may be simultaneously performed by performing a hot forging process (ST3c) after the second hot forging process (ST2b).

Further, although the initial shape of the ingot when the second hot forging (ST2b) is performed is a quadrangular prism in the embodiments described above, the shape is not limited thereto and may be a column or another polygonal prism.

DESCRIPTION OF SYMBOLS

10 to 14,30,31 ingot
15,31 formed body

The invention claimed is:

1. A method of manufacturing a sputtering target, comprising: forging an ingot formed of metal having a substantially cylindrical shape by applying a stress in a first axis direction parallel to an axial direction of the ingot;
   forging the ingot by applying a stress in a plane direction orthogonal to the first axis direction to deform the ingot from the cylindrical solid shape to a rectangular parallelepiped shape;
   additionally forging the ingot by applying a stress in a second axis direction obliquely intersecting with a direction parallel to the first axis direction;
   applying the stress in the second axis direction includes compression-deforming the ingot having the rectangular parallelepiped shape between opposed corners of the ingot; and
   heat-treating the ingot at a temperature equal to or higher than a recrystallization temperature thereof.

2. The method of manufacturing a sputtering target according to claim 1, further comprising forging the ingot by applying a stress in a third axis direction that obliquely intersects with the direction parallel to the first axis direction and is not parallel to the second axis direction.

3. The method of manufacturing a sputtering target according to claim 1, wherein
   the metal is tantalum, titanium, aluminum, copper, or an alloy containing any of them as a main component.

* * * * *